(12) United States Patent
Komatsu (10) Patent No.: US 10,170,394 B2
(45) Date of Patent: Jan. 1, 2019

(54) SEMICONDUCTOR DEVICE

(71) Applicant: FUJI ELECTRIC CO., LTD., Kawasaki-shi, Kanagawa (JP)

(72) Inventor: Kousuke Komatsu, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/230,907

(22) Filed: Aug. 8, 2016

(65) Prior Publication Data
US 2016/0343642 A1 Nov. 24, 2016

Related U.S. Application Data

(63) Continuation of application No. PCT/JP2015/068065, filed on Jun. 23, 2015.

(30) Foreign Application Priority Data

Aug. 12, 2014 (JP) .................................. 2014-64427

(51) Int. Cl.
*H01L 23/48* (2006.01)
*H01L 23/00* (2006.01)
(Continued)

(52) U.S. Cl.
CPC ........ *H01L 23/48* (2013.01); *H01L 23/49811* (2013.01); *H01L 24/83* (2013.01); *H01L 25/07* (2013.01); *H01L 25/18* (2013.01); *H01L 23/3735* (2013.01); *H01L 24/29* (2013.01); *H01L 24/32* (2013.01); *H01L 24/33* (2013.01); *H01L 24/48* (2013.01);
(Continued)

(58) Field of Classification Search
None
See application file for complete search history.

(56) References Cited

U.S. PATENT DOCUMENTS 6,365,965 B1 4/2002 Jeun
6,623,283 B1 * 9/2003 Torigian ................. H01R 12/57
439/83

(Continued)

FOREIGN PATENT DOCUMENTS

JP S63-254689 A 10/1988
JP H06-291230 A 10/1994
(Continued)

OTHER PUBLICATIONS

PCT, "International Search Report for International Application No. PCT/JP2015/068065".
(Continued)

*Primary Examiner* — Walter H Swanson
*Assistant Examiner* — Kien C Ly
(74) *Attorney, Agent, or Firm* — Manabu Kanesaka (57) ABSTRACT

A semiconductor device includes a laminated substrate having a circuit board; a semiconductor chip fixed to the circuit board; a terminal having a leading end portion with a cylindrical shape and a wiring portion with a shape other than the cylinder, the leading end portion and the wiring portion being formed of one conductive member; and a joining material which electrically and mechanically connects the circuit board and the leading end portion.

15 Claims, 9 Drawing Sheets

(51) Int. Cl.
  *H01L 25/07* (2006.01)
  *H01L 25/18* (2006.01)
  *H01L 23/498* (2006.01)
  *H01L 23/373* (2006.01)

(52) U.S. Cl.
  CPC .. *H01L 2224/291* (2013.01); *H01L 2224/293* (2013.01); *H01L 2224/2919* (2013.01); *H01L 2224/2929* (2013.01); *H01L 2224/29294* (2013.01); *H01L 2224/32105* (2013.01); *H01L 2224/32106* (2013.01); *H01L 2224/32225* (2013.01); *H01L 2224/32227* (2013.01); *H01L 2224/32245* (2013.01); *H01L 2224/33181* (2013.01); *H01L 2224/48091* (2013.01); *H01L 2224/48105* (2013.01); *H01L 2224/48227* (2013.01); *H01L 2224/73265* (2013.01); *H01L 2224/834* (2013.01); *H01L 2224/8384* (2013.01); *H01L 2224/83385* (2013.01); *H01L 2224/83447* (2013.01); *H01L 2224/83455* (2013.01); *H01L 2224/83815* (2013.01); *H01L 2224/83851* (2013.01); *H01L 2224/85447* (2013.01); *H01L 2924/00014* (2013.01); *H01L 2924/15151* (2013.01); *H01L 2924/15159* (2013.01); *H01L 2924/15162* (2013.01); *H01L 2924/181* (2013.01)

(56) References Cited

U.S. PATENT DOCUMENTS

| | | | |
|---|---|---|---|
| 9,648,722 B2* | 5/2017 | Gerhaußer | H05K 1/0207 |
| 2004/0214480 A1* | 10/2004 | Kitajima | H01R 13/055 |
| | | | 439/876 |
| 2006/0281347 A1* | 12/2006 | Wu | H01R 13/115 |
| | | | 439/83 |
| 2007/0235860 A1 | 10/2007 | Steger et al. | |
| 2009/0194884 A1* | 8/2009 | Stolze | H01L 25/072 |
| | | | 257/773 |
| 2010/0027228 A1* | 2/2010 | Tsukada | H05K 1/0204 |
| | | | 361/772 |
| 2010/0127383 A1 | 5/2010 | Oka et al. | |
| 2013/0017740 A1 | 1/2013 | Yeh et al. | |
| 2013/0273787 A1 | 10/2013 | Mitose et al. | |
| 2014/0174823 A1 | 6/2014 | Pao et al. | |
| 2014/0376202 A1* | 12/2014 | Shibutani | H01L 23/49811 |
| | | | 361/767 |

FOREIGN PATENT DOCUMENTS

| | | |
|---|---|---|
| JP | H09-129797 A | 5/1997 |
| JP | H10-041460 A | 2/1998 |
| JP | 2004-006603 A | 1/2004 |
| JP | 2006-295158 A | 10/2006 |
| JP | 2010-283107 A | 12/2010 |
| JP | 2011-138998 A | 7/2011 |
| WO | 2012/077740 A1 | 6/2012 |

OTHER PUBLICATIONS

Japan Patent Office, "Office Action for Japanese Patent Application No. 2016-542518," dated Aug. 15, 2017.

China Patent Office, "Office Action for Chinese Patent Application No. 201580007474.1," dated Jul. 25, 2018.

* cited by examiner

SEMICONDUCTOR DEVICE

CROSS-REFERENCE TO RELATED APPLICATION

This is a continuation application of PCT/JP2015/068065 filed on Jun. 23, 2015, which claims priority of Japanese Patent Application No. 2014-164427 filed on Aug. 12, 2014, the disclosure of which is incorporated herein.

TECHNICAL FIELD

The present invention relates to a semiconductor device.

BACKGROUND ART

A power semiconductor module which is one of semiconductor devices includes a laminated substrate, a semiconductor chip, a housing, and terminals. The laminated substrate is formed by laminating, for example, a circuit board, an insulating plate, and a metal plate in order. Also, the semiconductor chip is electrically and mechanically connected to one region of the circuit board by a joining material. Also, the housing houses a metal substrate and the semiconductor chip, and the inside of the housing is filled with a seal material. One end of each of the terminals is electrically and mechanically connected to each of electrodes and the circuit board, which are provided on the front surface of the semiconductor chip, by respective joining materials, and the other end of the terminals is led outside the housing. The joining materials are, for example, solder.

The power semiconductor module has roughly two types of terminals, and one of them is a main terminal. The main function of the main terminal is to cause a main current to flow by way of the semiconductor chip or the like. The other is a control terminal, which is also called a sense terminal. The main function of the control terminal is to input a control signal into the semiconductor chip and to lead a temperature detection signal.

The sectional area of a portion of the main terminal joined to the circuit board has a predetermined area necessary according to current rating. Also, from the viewpoint of securing reliability, the main terminal and the circuit board are soldered in a shape such that they can be sufficiently joined. Meanwhile, in the control terminal only a microcurrent flows therethrough or only a voltage is applied thereto. Because of this, the area of a portion of the control terminal joined to the front surface electrode of the semiconductor chip or to the circuit board has a predetermined area corresponding to the package shape of a product regardless of the current rating of the main current. The region of the front surface electrode of the semiconductor chip, or of the circuit board, which is joined to the terminal, has a larger area than the leading end of the terminal.

PTL 1 illustrates a terminal which is formed of a conductive plate and has a leading end folded in an L-shape. Also, PTL 2 describes a terminal which is formed of a wire pin and a cylindrical portion in which to insert the wire pin.

CITATION LIST

Patent Literature

PTL 1: JP-A-2004-6603
PTL 2: JP-A-2010-283107

SUMMARY OF INVENTION

Technical Problem

When joining the terminal having the leading end folded in an L-shape and the circuit board, the leading end of the terminal is lapped on a solder paste applied to the circuit board and is heated. The solder melted by being heated coagulates in the vicinity of the leading end of the terminal due to surface tension.

However, there is a case in which one portion of the melted solder scatters and adheres to the side surface of the circuit board. This raises fear of causing insulation failure. Also, there is a case in which the melted solder comes into a state in which it spreads to the end portion of the circuit board. This raises fear that heat stress is generated due to the difference in linear expansion coefficient between the solder and the circuit board, and the circuit board separates from the insulating plate, when in a heat cycle test or heat shock test of the power semiconductor module.

As measures against the heretofore described insulation failure and separation, measures to space the joining position of the terminal from the end portion of the circuit board, and to sufficiently increase the area of the circuit board relative to the sectional area of the leading end of the terminal, are taken. However, the measures limit the degree of freedom of disposition of the circuit board.

The invention is to advantageously solve the heretofore described problems and has for its object to provide a semiconductor device which can prevent the separation and insulation failure between the circuit board and the insulating plate and can improve the degree of freedom of disposition of the circuit board.

Solution to Problem

A semiconductor device of an aspect of the invention includes a laminated substrate having a circuit board; a semiconductor chip fixed to the circuit board; a terminal having a leading end portion with a cylindrical shape and a wiring portion with a shape other than the cylinder, the leading end portion and the wiring portion being formed of one conductive member; and a joining material which electrically and mechanically connects the circuit board and the leading end portion.

Also, a semiconductor device of another aspect of the invention includes a laminated substrate having a circuit board; a semiconductor chip which includes electrodes on a front surface, and a rear surface fixed to the circuit board; terminals each having a leading end portion with a cylindrical shape and a wiring portion with a shape other than the cylinder, the leading end portion and the wiring portion being formed of one conductive member; and joining materials which electrically and mechanically connect the electrode and the leading end portion, respectively.

Advantageous Effects of Invention

According to the semiconductor device of the invention, it is possible to prevent the separation and insulation failure between the circuit board and the insulating plate, and it is possible to improve the degree of freedom of disposition of the circuit board.

DESCRIPTION OF EMBODIMENTS

Embodiment 1

Hereafter, a specific description will be given, while referring to the drawings, of embodiments of a semiconductor device of the invention.

Figure 1:
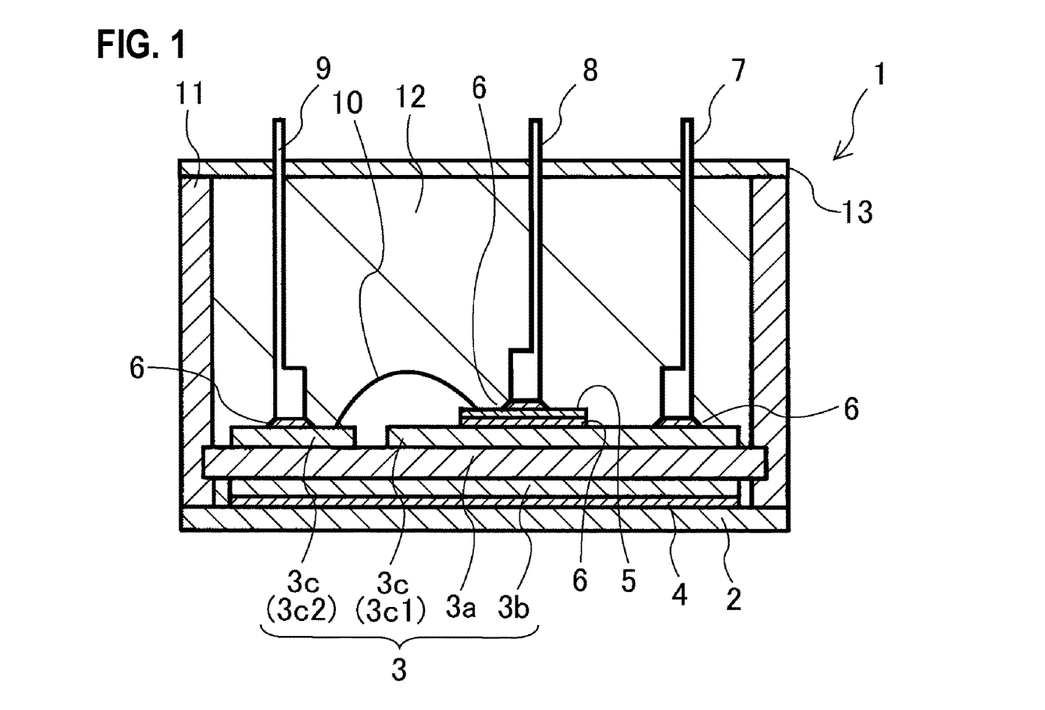
FIG. 1 is a schematic sectional view of a semiconductor device of Embodiment 1 of the invention.

A semiconductor device 1 of this embodiment shown in schematic sectional view in FIG. 1 is an example of a power semiconductor module. The semiconductor device 1 includes a laminated substrate 3, a semiconductor chip 5, terminals 7 to 9, and joining materials 6. Furthermore, the semiconductor device 1 includes a base plate 2, a frame body 11, a seal material 12, and a cover 13.

The laminated substrate 3 includes an insulating plate 3a, a metal plate 3b provided on one surface of the insulating plate 3a, and circuit boards 3c provided on the other surface of the insulating plate 3a. The insulating plate 3a and the metal plate 3b have a substantially quadrangular shape in plan. The insulating plate 3a is made of, for example, insulating ceramics, such as aluminum nitride, silicon nitride, or aluminum oxide, and the metal plate 3b and the circuit boards 3c are made of, for example, copper. As the laminated substrate 3, it is possible to use a DCB (Direct Copper Bond) substrate or the like wherein the metal plate 3b and the circuit boards 3c are joined directly to the insulating plate 3a. The metal plate 3b is joined to the principal surface of the base plate 2 by a joining material 4 such as a solder.

The circuit boards 3c have 3c1 and 3c2, in which a predetermined circuit is formed, in the example shown in the drawing. The semiconductor chip 5 is joined to the circuit board 3c1 by the conductive joining material 6, for example, a solder. The conductive joining material can be one type selected from a solder, a metal paste, and a conductive adhesive.

Electrodes are provided on the front surface and rear surface of the semiconductor chip 5. Further, the electrode on the rear surface is electrically and mechanically connected to the circuit board 3c1 via a conductive joining material 4 such as a solder. "Being electrically and mechanically connected" is defined as including not only a case in which objects are joined directly to each other, but also a case in which objects are joined to each other via a conductive joining material, such as a solder or a metal sintered member, and the same applies in the following description.

The semiconductor chip 5 is specifically, for example, a Schottky barrier diode, a power MOSFET, or an IGBT (insulated gate bipolar transistor). The semiconductor chip 5 may be a silicon semiconductor, or may be a SiC semiconductor. When the semiconductor chip 5 is a silicon carbide (SiC) power MOSFET, the SiC power MOSFET, having a high breakdown voltage compared with a silicon semiconductor chip and being switchable at a high frequency, is most suitable as the semiconductor chip 5 of the semiconductor device of this embodiment. However, the semiconductor chip 5 is not limited to an IGBT or a power MOSFET, only has to be a combination of one or a plurality of semiconductor elements which can operate to switch.

In this embodiment, a description will be given, as an example, of a case in which the semiconductor chip 5 is an IGBT. In this case, the electrode on the rear surface of the semiconductor chip 5 is a collector electrode, while the electrodes on the front surface are an emitter electrode and a gate electrode.

The terminal 7 which is a main terminal is electrically and mechanically joined to the circuit board 3c1 by the conductive joining material 6 such as a solder. The terminal 7 is electrically connected to the collector electrode on the rear surface of the semiconductor chip 5. Also, the terminal 8 which is a main terminal is electrically and mechanically connected to the emitter electrode on the front surface of the semiconductor chip 5 by the conductive joining material 6 such as a solder. Furthermore, the terminal 9 which is a control terminal to be electrically connected to the gate electrode of the semiconductor chip 5 is electrically and mechanically connected to the circuit board 3c2 by the conductive joining material 6 such as a solder. The circuit board 3c2 and the gate electrode of the semiconductor chip are electrically connected by a bonding wire 10. That is, in this embodiment, the terminal 7 is a collector terminal, the terminal 8 is an emitter terminal, and the terminal 9 is a gate terminal.

The metallic base plate 2 for heat release is made of a metal with a good heat conductivity, for example, copper, and has a substantially quadrangular shape in plan.

The frame body 11 made of a resin is bonded to the peripheral edge of the base plate 2 by an unshown adhesive. Also, the cover 13 is fixed to the top portion of the frame body 11. The base plate 2, the frame body 11, and the cover 13 form a housing of the semiconductor device 1. Further, the laminated substrate 3 and the semiconductor chip 5 are housed in the housing, and the housing is filled with the seal material 12 which enhances insulation.

Figure 2A:
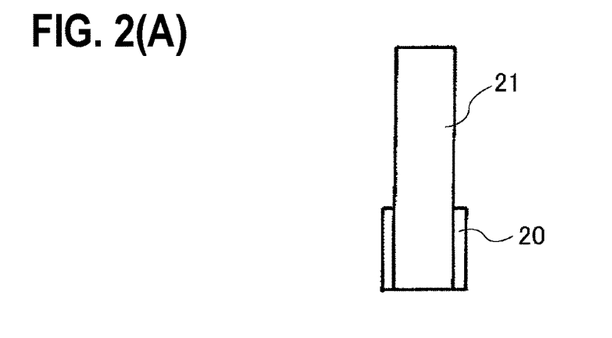
FIGS. 2(A)-2(D) show illustrations of a terminal of Embodiment 1.
Figure 2B:
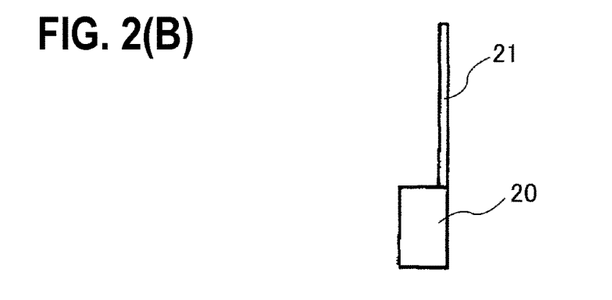
Figure 2C:
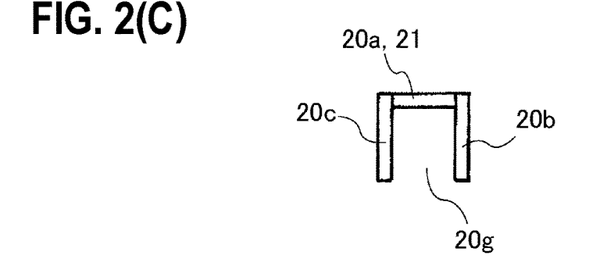
Figure 2D:
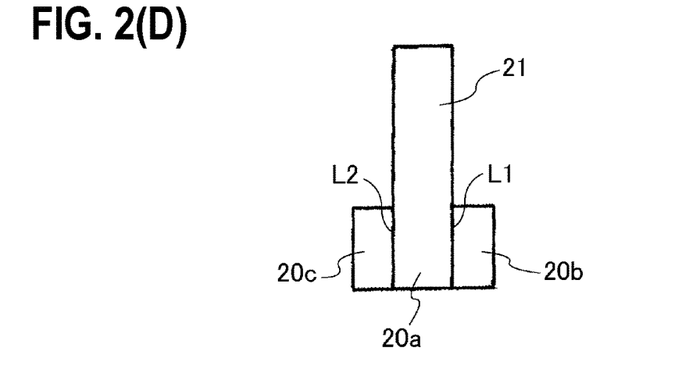

FIGS. 2(A)-2(D) show a front view (FIG. 2(A)), side view (FIG. 2(B)), and plan view (FIG. 2(C)) of each terminal 7 to 9. Also, FIG. 2(D) is a development view of each terminal 7 to 9 before leading end portion formation.

The terminals 7 to 9 are each formed of a leading end portion 20 and a wiring portion 21. The leading end portion 20 is electrically and mechanically connected to each of the circuit boards 3c and the front surface electrode of the semiconductor chip 5 using the joining material 6. Also, the wiring portion 21 has a function to install electrical wiring to a predetermined portion of the semiconductor device 1 from the portion of the wiring portion 21 connected to the leading end portion 20. Further, the leading end portion 20 has a cylindrical shape, and the wiring portion 21 has a shape (in this embodiment, a plate-like shape) other than a cylindrical shape. The leading end portion 20 has a side surface 20a, which is continuous with the wiring portion 21, and side surfaces 20b and 20c perpendicular to the side surface 20a. Further, a gap 20g extending in an axial direction of the cylinder is disposed between the side surface 20b and the side surface 20c. That is, the terminals 7 to 9 are each such that the leading end portion 20 and the wiring portion 21 are formed by one conductive member. In this embodiment, as can be seen from the development view of (D) of FIG. 2, one conductive plate is folded along folding lines L1 and L2 to dispose the side surfaces 20a, 20b, and 20c and gap 20g, thus forming the leading end portion 20 of the cylindrical shape. As shown in FIG. 2(C), the leading end portion 20 has an approximately U-shape in horizontally cross-section having three side surfaces. In other words, a section of the leading end portion 20 perpendicular to the axis of the cylinder has a quadrangular, more specifically, rectangular shape with one side open.

The gap 20g extends in the axial direction of the cylinder of the leading end portion 20. Further, the gap 20g is provided in a portion opposite to the side surface 20a which is the portion of the leading end portion 20 linked to the wiring portion 21.

The material of the terminals 7 to 9 is a copper plate and is plated with nickel as needed. As the terminals 7-9, it becomes easy to procure the material if using the same material as that of a conductive plate, specifically, a lead which is used in a common power semiconductor module. Because of this, it is possible to manufacture the terminals 7 to 9 at a low cost.

A description will be given, using FIG. 3, of working effects of each terminal 7 to 9 (herein, the terminal 9 which is the control terminal) having the leading end portion 20. When joining the terminal 9, the joining material 6 is heated with a space c of on the order of 0.5 to 1.0 mm between the circuit board 3c2 and the leading end of the terminal 9. The melted joining material 6 coagulates due to surface tension and comes into contact with the leading end of the terminal 9. As the leading end portion 20 is cylindrical, the melted joining material 6 is drawn by capillarity into the cylindrical leading end portion 20. Further, when the melted joining material 6 is cooled and solidified, a fillet 6a is formed between the circuit board 3c2 and the leading end of the terminal 9. The area taken up by the joining material 6 on the circuit board 3c2 is the sum of the portion surrounded by the leading end portion 20 and the fillet 6a. The area is small compared with the case when using a terminal, described in PTL 1, which has a leading end folded in an L-shape. Consequently, as the melted joining material 6 does not spread to the end portion of the circuit board 3c2, it is possible to prevent the circuit boards 3c from separating from the insulating plate 3a. Also, as it is possible to prevent one portion of the melted joining material 6 from scattering and adhering to the side surface at the end portion of the circuit board 3c, it is possible to prevent insulation failure.

Also, as the leading end portion 20 has a simple structure compared with a cylindrical portion described in PTL 2, it is possible to reduce the cost of members. Furthermore, it is easy to fold the leading end portion 20, and it is possible to reduce the number of steps compared with the process of soldering the cylindrical portion described in PTL 2 in advance and furthermore inserting a wire pin, and thus possible to reduce manufacturing costs.

Still furthermore, in the technology described in PTL 2, as a problem arises in inserting the wire pin when too much melted joining material is pulled into the cylindrical portion, it is necessary to strictly control the amount of joining material. Meanwhile, in this embodiment, as there is no particular problem even when too much melted joining material 6 is drawn into the cylindrical leading end portion 20, it is not necessary to strictly control the amount of joining material. Because of this, it is possible to reduce the manufacturing costs. In order to prevent the joining material 6 overflowing from the leading end portion 20 even when the joining material 6 is in excess, it is preferable to make the height of the leading end portion 20 higher than the height of the joining material 6 drawn into the leading end portion 20.

It is preferable to set the space c between the circuit board 3c and the leading end of the terminal 9 to on the order of 0.5 to 1.0 mm because the joining material 6 in the vicinity of the leading end of the terminal 9 can form the fillet 6a of a good shape.

By the leading end portion 20 having the gap 20g, the joining material 6 melted when heated can move into and out of the cylindrical leading end portion 20 through the gap 20g. Because of this, it is possible to form the fillet 6a large in width and height compared with the case when the leading end portion 20 has no gap 20g. Consequently, it is possible to enhance the joining strength of the joining material 6, and thus possible to improve joining reliability.

Also, as shown in FIG. 1, end portions of the wiring portions 21 of the terminals 7 to 9 on the opposite side to the leading end portions 20 can also be directly led outside the housing of the semiconductor device 1. This is because as the terminals 7 to 9 are rigidly joined by the cylindrical leading end portions 20, it does not happen that the junctions separate even when stress from outside is applied to the terminals 7 to 9. As the need for dedicated external lead-out terminals is eliminated by directly leading the wiring portions 21 outside the housing, it is possible to reduce the manufacturing costs.

Also, in this embodiment, the wiring portions 21 have a plate-like shape, but may have any shape other than a cylindrical shape as long as it is possible to easily wire the wiring portions to predetermined portions. In this embodiment, the reason for the wiring portions 21 having a shape other than a cylindrical shape is that as a cylindrical shape is difficult to bend easily, it is difficult for the wiring portions in cylindrical shape to be wired to the predetermined portions. Because of this, a plate-like shape, a rod-like shape, a wire-like shape, or the like, which is easy to bend is suitable as the shape of the wiring portions 21.

In this embodiment, the semiconductor device 1 is formed using the frame body 11, seal material 12, and cover 13. Meanwhile, it is also possible to form the semiconductor device by sealing the semiconductor chip and the like by insert molding using a thermosetting resin. By so doing, it becomes possible to reduce the size of the semiconductor device.

Also, in this embodiment, a solder is used as the joining material 6, but any joining material may be used as long as it is a conductive joining material in a liquid state in which the fillet 6a can be formed at the leading end portion 20. As the joining material 6, it is also possible to use, for example, a metal paste or a conductive adhesive.

Embodiment 2

Figure 4:
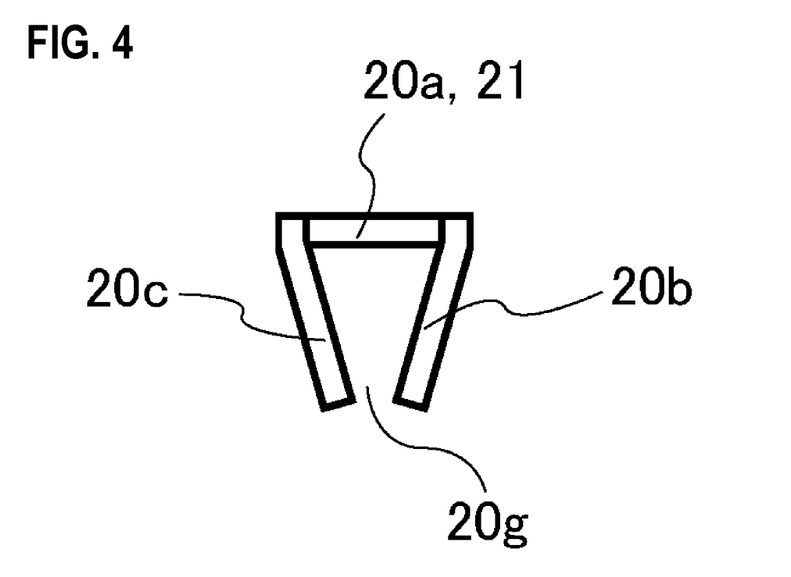
FIG. 4 is an illustration of a terminal of Embodiment 2.

FIG. 4 shows a plan view of each terminal 7 to 9 of Embodiment 2. This is a diagram corresponding to FIG. 2(C) of Embodiment 1.

In the terminals 7 to 9 of the semiconductor device of Embodiment 2, the angle to which the side surfaces 20b and 20c are bent is increased to reduce the gap 20g between both side ends. By so doing, the shape of the leading end portion 20 in section perpendicular to the axis of the cylinder has an approximately trapezoidal shape. Other structures are the same as those of Embodiment 1 described using FIGS. 2(A)-2(D) and 3. The terminals 7 to 9 of this embodiment have the same working effects as the terminals 7 to 9 of Embodiment 1. Still furthermore, as it is possible to reduce the junction area compared with in Embodiment 1, there is effectiveness when joining each terminal to a narrow region.

Embodiment 3

Figure 5A:
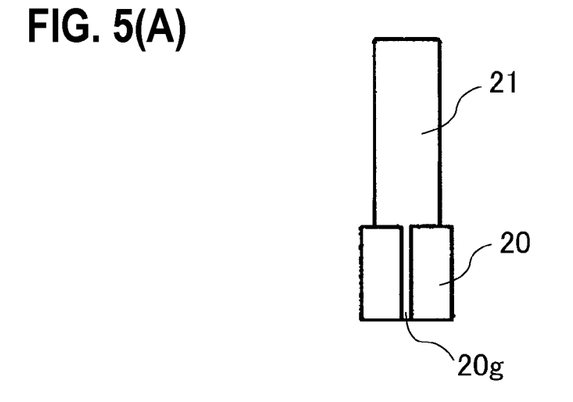
FIGS. 5(A)-5(C) show illustrations of a terminal of Embodiment 3.
Figure 5B:
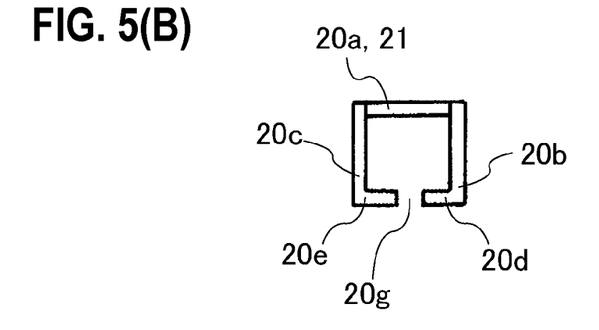
Figure 5C:
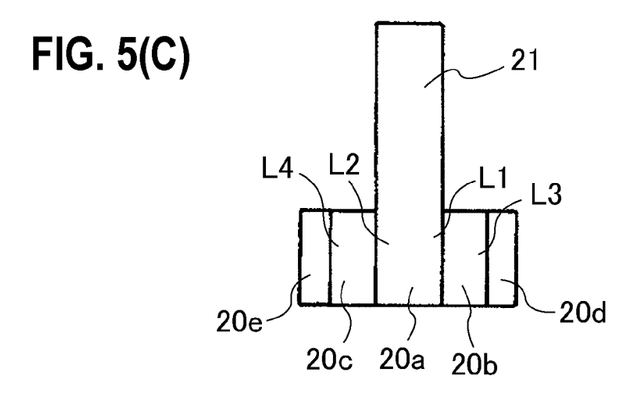

FIGS. 5(A)-5(C) show each terminal 7 to 9 of Embodiment 3. These are diagrams corresponding to FIGS. 2(A), 2(C) and 2(D) of Embodiment 1.

Each of the terminals 7 to 9 of the semiconductor device of Embodiment 3 has a cylindrical leading end portion 20 of an approximately rectangular shape in horizontally cross-section and a wiring portion 21 of a plate-like shape. The leading end portion 20 has a side surface 20a continuous with the wiring portion 21, side surfaces 20b and 20c perpendicular to the side surface 20a, and side surfaces 20d and 20e perpendicular to and shorter in width than the side surfaces 20b and 20c. Further, a gap 20g extending in an axial direction of the cylinder is disposed between the side surface 20d and the side surface 20e. As can be seen from the development view of FIG. 5(C), one conductive plate is folded along folding lines L1 to L4 to dispose the side surfaces 20a to 20e and gap 20g, thus forming the cylindrical leading end portion 20.

The terminals 7 to 9 of Embodiment 3 have the same structures as the terminals 7 to 9 of Embodiments 1 and 2, except that the leading end portions 20 have different shapes in horizontally cross-section. Further, the terminals 7 to 9 of this embodiment have the same working effects as the terminals 7 to 9 of Embodiments 1 and 2. Furthermore, in this embodiment, as the area of the side surfaces of the leading end portion 20 is wide compared with in Embodiments 1 and 2, the capillary action of the melted joining material 6 becomes likely to occur.

The terminals 7 to 9 are not limited to have the leading end portions 20 of the rectangular and trapezoidal shapes in horizontally cross-section described in Embodiments 1 to 3, and can be modified in various ways. The shape in horizontally cross-section can be made, for example, polygonal or circular. The inner diameter of the leading end portion 20 is an inner diameter such that the melted joining material 6 can be drawn by capillarity.

Embodiment 4

Figure 6A:
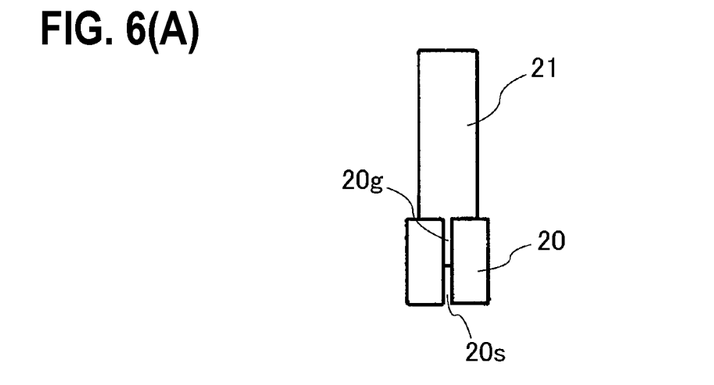
FIGS. 6(A)-6(C) show illustrations of a terminal of Embodiment 4.
Figure 6B:
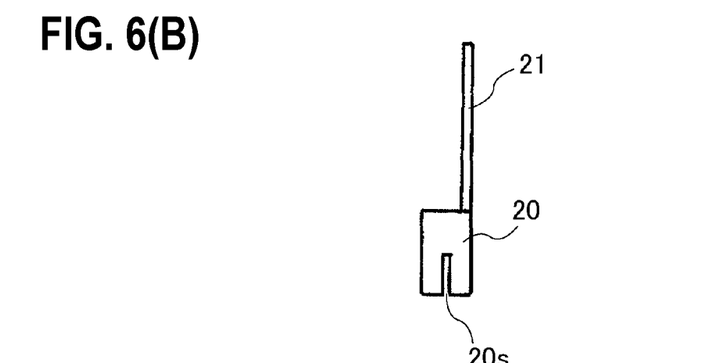
Figure 6C:
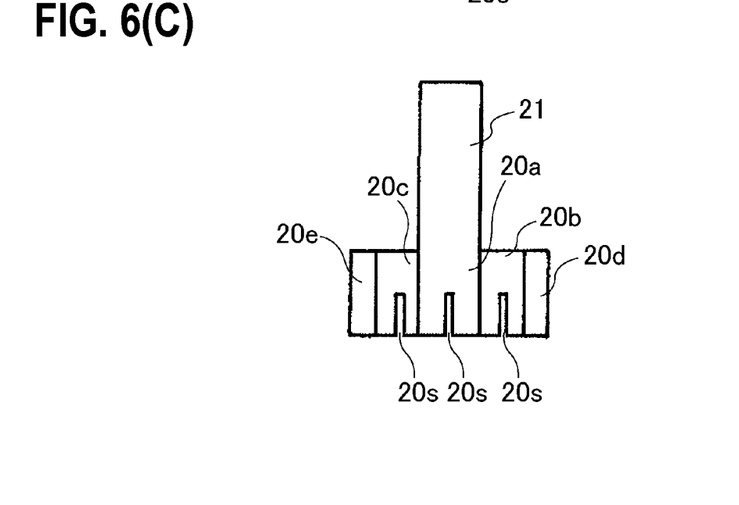

FIGS. 6(A)-6(C) show terminals 7 to 9 of Embodiment 4. These are diagrams corresponding to FIGS. 2(A), 2(B) and 2(D) of Embodiment 1.

Each of the terminals 7 to 9 of the semiconductor device of Embodiment 4 has a cylindrical leading end portion 20 of an approximately rectangular shape in horizontally cross-section, and a wiring portion 21 of a plate-like shape, in the same way as the terminals 7 to 9 of Embodiment 3. Furthermore, in this embodiment, as shown in the side view of FIG. 6(B) and the development view of FIG. 6(C), a plurality of, in the example shown in the drawings, three, slits 20s extending in an axial direction of the cylinder is disposed one in each of respective portions of the side surface 20a, side surface 20b, and side surface 20c on the side which is connected by the joining material 6.

That is, the terminals 7 to 9 of Embodiment 4 have the same structures as the terminals 7 to 9 of Embodiment 3, except that the slits 20s are disposed. Consequently, the terminals 7 to 9 of Embodiment 4 have the same effects as the terminals 7 to 9 of Embodiment 3. Furthermore, in the terminals 7 to 9 of Embodiment 4, as the slits 20s are disposed in the leading end portion 20, the joining material 6 melted when heated can move into and out of the cylindrical leading end portion 20 through the slits 20s. Because of this, a fillet 6a large in width and height is formed compared with when the leading end portion has no slit 20s.

Figure 7A:
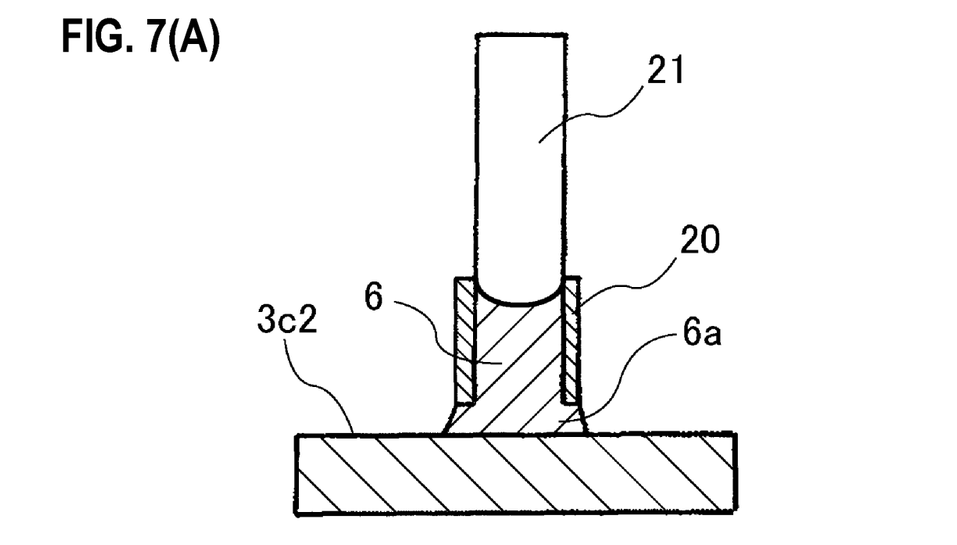
FIGS. 7(A) and 7(B) show sectional views of working effects of the terminals of Embodiment 3 and Embodiment 4.
Figure 7B:
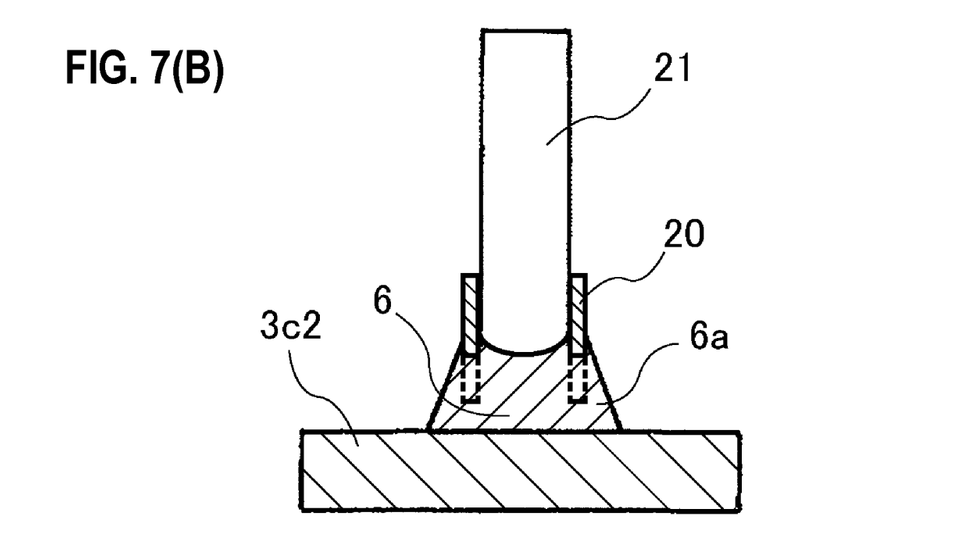

FIG. 7(A) shows a sectional view of Embodiment 3 having no slit 20s, and FIG. 7(B) shows a sectional view of Embodiment 4 having the slits 20s. To compare FIG. 7(A) and FIG. 7(B), the fillet 6a of the joining material 6 is larger in Embodiment 4 than in Embodiment 3. Consequently, in Embodiment 4, as it is possible to further enhance the joining strength of the terminals 7 to 9, there is effectiveness when the joining strength is needed. Also, in Embodiment 3, as it is possible to narrow the width of the joining material 6, there is effectiveness in narrowing the area of installment of the joining material 6, for example, when it is not possible to take up a wide area for electrodes and circuit boards.

Also, in this embodiment, the slits 20s are disposed one in each of the opposing side surfaces 20b and 20c. By disposing two slits 20s, one in each of mutually opposing positions, in this way, it is possible to form the fillet 6a of the joining material 6 in an axisymmetric shape as shown in FIG. 7(B). Because of this, in the leading end portion 20, as it is possible to equalize the force with which the opposing side surfaces are joined together, thus improving reliability, effectiveness is increased. As previously described, the gap 20g also has the same function as the slits 20s. Because of this, it is also effective that the gap 20g and the slit 20s are disposed in mutually opposing positions, as shown in this embodiment.

Figure 3:
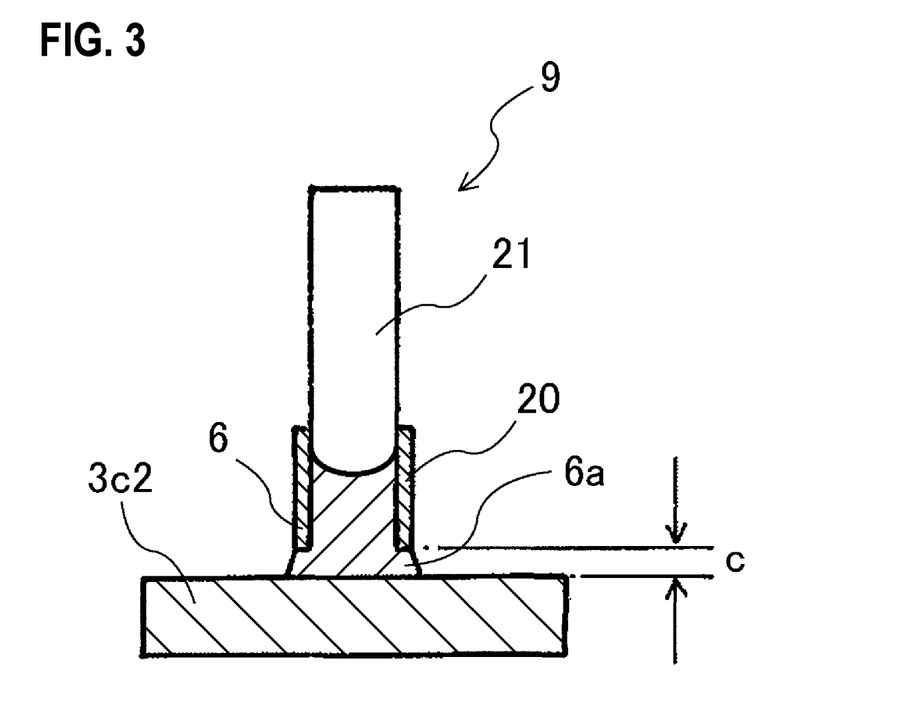
FIG. 3 is a sectional view of working effects of the terminal of Embodiment 1.

The shape in horizontally cross-section of the leading end portions of the terminals 7 to 9 having the slits 20s is not limited to the rectangle shown in FIGS. 6(A)-6(C), and can also be applied to the trapezoid shown in FIG. 3 or any other shape in horizontally cross-section, such as a polygon or a circle.

Reference Example

Figure 8:
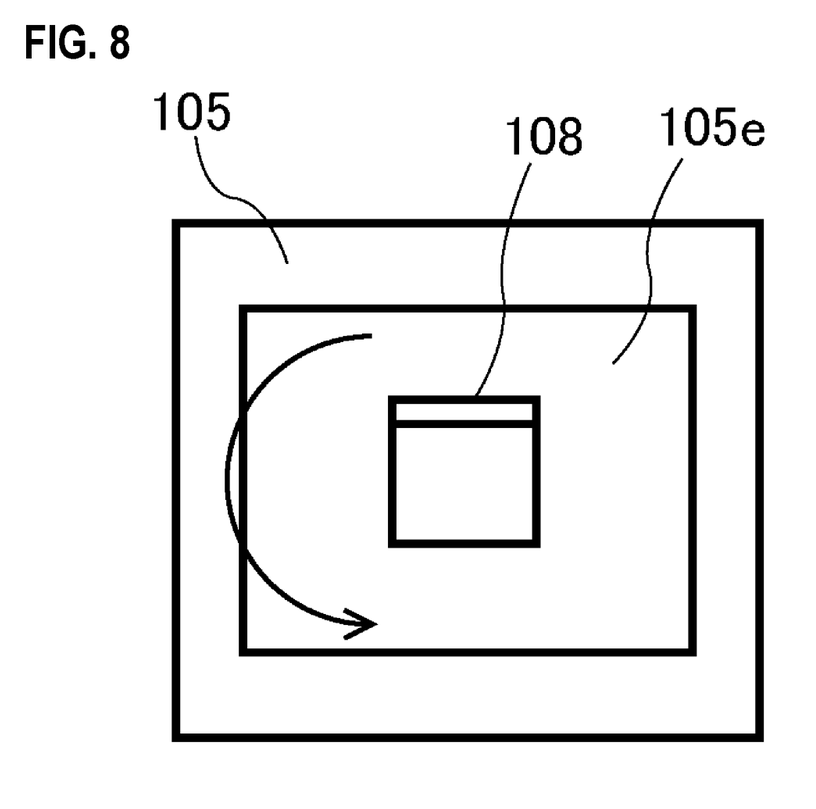
FIG. 8 is a plan view when a terminal of a reference example is used for connection to a semiconductor chip.

FIG. 8 is a plan view when an L-shaped terminal 108 described in PTL 1 is used for connection to a semiconductor chip 105.

The L-shaped terminal 108 is electrically and mechanically connected to an electrode 105e on the front surface of the semiconductor chip 105 by a conductive joining material (not shown). Also, the front surface electrode disposed on the semiconductor chip 5 is formed in a rectangular shape.

For the semiconductor chip 105, there is a case in which the junction of the chip rear surface and a circuit board by a joining material, and the junction of the front surface and a terminal 108 by a joining material, are implemented by the same heating process. In this case, as the joining material on the rear surface side of the semiconductor chip is also melted, there is fear that when the shape of the leading end of the terminal 108 is relatively small compared with the electrode 105e, the semiconductor chip 105 rotates on the spot.

Embodiment 5

Figure 9:
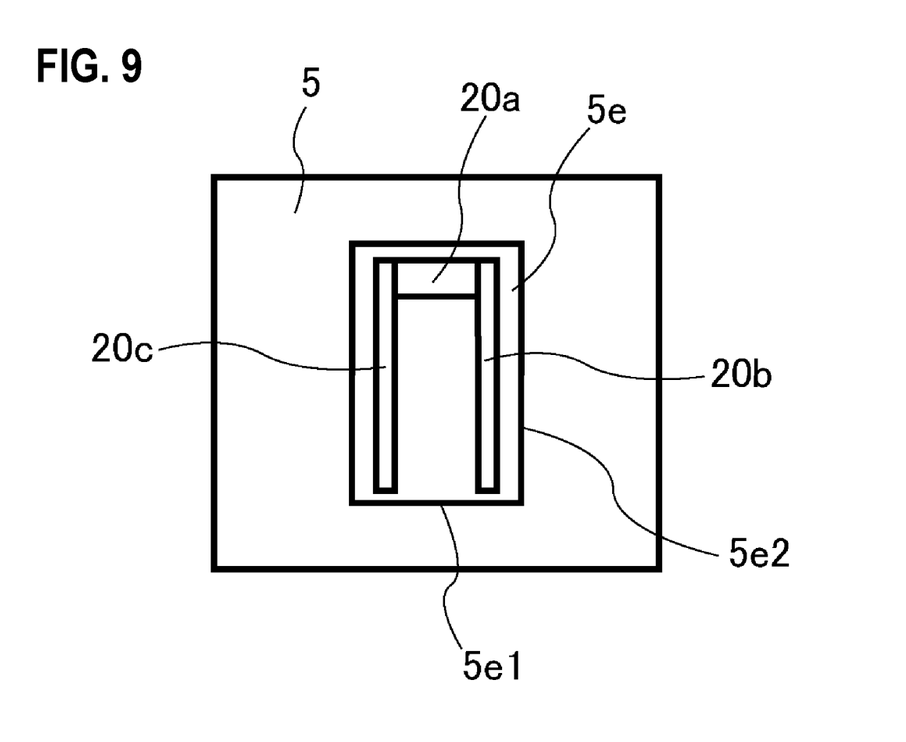
FIG. 9 is a plan view when a terminal of Embodiment 5 is used for connection to a semiconductor chip.

FIG. 9 is a plan view when a terminal 8 of Embodiment 5 is used for connection to a semiconductor chip 5.

In Embodiment 5, one of the sides of the terminal 8 which form side surfaces 20a, 20b, and 20c is made longer than one side 5e1 (a short side) or 5e2 (a long side) of a rectangular electrode 5e on the front surface of the semiconductor chip 5. In other words, the side surface 20b (20c) which is the long side of the terminal 8 is made longer than the short side 5e1 of the electrode 5e. By so doing, it is possible to prevent the semiconductor chip 5 from rotating on the spot. That is, this embodiment enables self-alignment of the semiconductor chip 5.

Heretofore, a specific description has been given, using the drawings and embodiments, of the semiconductor device of the invention, but the semiconductor device of the invention is not limited to the descriptions in the embodiments and drawings, and can be variously modified without departing from the scope of the invention. For example, the leading end portion 20 is not limited to be provided perpendicular to the front surface of the circuit board 3c or semiconductor chip 5, but may have a predetermined angle. Also, a solder paste may be adhered in advance to the leading end portion 20.

REFERENCE SIGNS LIST

1 SEMICONDUCTOR DEVICE
2 BASE PLATE
3 LAMINATED SUBSTRATE
3a INSULATING PLATE
3b METAL PLATE
3c, 3c1, 3c2 CIRCUIT BOARD
4 JOINING MATERIAL
5 SEMICONDUCTOR CHIP
5e ELECTRODE
6 JOINING MATERIAL
6a FILLET
7, 8, 9 TERMINAL
10 BONDING WIRE
11 FRAME BODY
12 SEAL MATERIAL
13 COVER
20 LEADING END PORTION
20a to 20e SIDE SURFACE
20g GAP
20s SLIT
21 WIRING PORTION

What is claimed is:

1. A semiconductor device comprising:
a laminated substrate having a circuit board;
a semiconductor chip fixed to the circuit board;
a terminal having a wiring portion with a plate shape, and a leading end portion with a hollow shape extending from the wiring portion, the wiring portion and the leading end portion being integrally formed of one conductive member, the leading end portion having a front open end forming an end of the terminal and a rear open end where a part of the leading end portion continues to the wiring portion; and
a joining material which electrically and mechanically connects the circuit board and the front open end of the leading end portion,
wherein the front open end of the leading end portion is located to face the circuit board, and is closed by the joining material entered into the front open end, and
a space is arranged between the front open end of the terminal and the circuit board so that the joining material enters the front open end of the leading end portion and the space to connect the leading end portion to the circuit board.

2. The semiconductor device according to claim 1, wherein the leading end portion has a gap extending in an axial direction of the hollow shape.

3. The semiconductor device according to claim 2, wherein the gap is provided in a portion opposite to a portion in which the leading end portion and the wiring portion are linked.

4. The semiconductor device according to claim 2, wherein the leading end portion has a section, perpendicular to the axial direction of the hollow shape, having a quadrangular shape with one side open.

5. The semiconductor device according to claim 1, wherein the leading end portion has one or more slits on a side connected by the joining material.

6. The semiconductor device according to claim 5, wherein the leading end portion has a plurality of the slits, and two of the slits are disposed at portions facing each other.

7. The semiconductor device according to claim 1, wherein the wiring portion is led outside a housing which houses the laminated substrate and the semiconductor chip.

8. The semiconductor device according to claim 1, wherein the leading end portion has a horizontal cross-section with a U-shape.

9. The semiconductor device according to claim 1, wherein the leading end portion has a horizontal cross-section with a rectangle or a circle.

10. A semiconductor device comprising:
a laminated substrate having a circuit board;
a semiconductor chip having electrodes on a front surface, and a rear surface fixed to the circuit board;
a terminal having a wiring portion with a plate shape, and a leading end portion with a hollow shape extending from the wiring portion, the wiring portion and the leading end portion being integrally formed of one conductive member, the leading end portion having a front open end forming an end of the terminal and a rear open end where a part of the leading end portion continues to the wiring portion; and
a joining material which electrically and mechanically connects the electrode and the front open end of the leading end portion,
wherein the front open end of the leading end portion is located to face the electrode, and is closed by the joining material entered into the front open end, and
a space is arranged between the front open end of the terminal and the electrode so that the joining material enters the front open end of the leading end portion and the space to connect the leading end portion to the electrode.

11. The semiconductor device according to claim 10, wherein the leading end portion perpendicular to an axis of the hollow shape, and the electrode have a section with a quadrangular shape, and one side of the section of the leading end portion is longer than one side of the electrode.

12. The semiconductor device according to claim 10, wherein the leading end portion has a gap extending in an axial direction of the hollow shape.

13. The semiconductor device according to claim 10, wherein the leading end portion has one or more slits on a side connected by the joining material.

14. The semiconductor device according to claim 10, wherein the leading end portion has a horizontal cross-section with a U-shape.

15. The semiconductor device according to claim 10, wherein the leading end portion has a horizontal cross-section with a rectangle or a circle.

* * * * *

UNITED STATES PATENT AND TRADEMARK OFFICE
CERTIFICATE OF CORRECTION

PATENT NO. : 10,170,394 B2
APPLICATION NO. : 15/230907
DATED : January 1, 2019
INVENTOR(S) : Kousuke Komatsu Page 1 of 1

It is certified that error appears in the above-identified patent and that said Letters Patent is hereby corrected as shown below:

On the Title Page

Please change the number of item (30) Foreign Application Priority Data, from "… 2014-64427" to --… 2014-164427--.

Signed and Sealed this
Twenty-sixth Day of February, 2019

Andrei Iancu
*Director of the United States Patent and Trademark Office*